United States Patent
Ikeda et al.

(10) Patent No.: US 8,569,800 B2
(45) Date of Patent: Oct. 29, 2013

(54) FIELD EFFECT TRANSISTOR

(75) Inventors: Nariaki Ikeda, Tokyo (JP); Takuya Kokawa, Tokyo (JP); Masayuki Iwami, Tokyo (JP); Sadahiro Kato, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 13/076,980

(22) Filed: Mar. 31, 2011

(65) Prior Publication Data

US 2011/0241017 A1    Oct. 6, 2011

Related U.S. Application Data

(60) Provisional application No. 61/406,399, filed on Oct. 25, 2010.

(30) Foreign Application Priority Data

Mar. 31, 2010    (JP) .................................. 2010-083172

(51) Int. Cl.
  *H01L 31/072*    (2012.01)
  *H01L 31/0336*   (2006.01)

(52) U.S. Cl.
  USPC ............. 257/200; 257/201; 257/392; 257/76; 438/217; 438/289

(58) Field of Classification Search
  USPC .................... 257/200–201, 392, 76, E29.251; 438/217, 289
  See application file for complete search history.

(56) References Cited

U.S. PATENT DOCUMENTS

| 7,038,253 B2 | 5/2006 | Yoshida et al. | |
| 2009/0242938 A1* | 10/2009 | Niiyama et al. | 257/194 |
| 2011/0241088 A1* | 10/2011 | Sato et al. | 257/288 |

FOREIGN PATENT DOCUMENTS

WO    03071607 A1    8/2003

OTHER PUBLICATIONS

D. Visalli, et al., "AlGaN/GaN/AlGaN Double Heterostructures on 4 inch Si Substrates for High Breakdown Voltage Field-Effect Transistors with low On-Resistance", Solid State Device Meetings 2008—proceedings, No. G-1-2, pp. 148-149.

* cited by examiner

*Primary Examiner* — Theresa T Doan
(74) *Attorney, Agent, or Firm* — Lowe, Hauptman & Ham

(57) ABSTRACT

A field effect transistor includes: a buffer layer that is formed on a substrate; a high resistance layer or a foundation layer that is formed on the buffer layer; a carbon-containing carrier concentration controlling layer that is formed on the high resistance layer or the foundation layer; a carrier traveling layer that is formed on the carrier concentration controlling layer; a carrier supplying layer that is formed on the carrier traveling layer; a recess that is formed from the carrier supplying layer up to a predetermined depth; source/drain electrodes that are formed on the carrier supplying layer with the recess intervening therebetween; a gate insulating film that is formed on the carrier supplying layer so as to cover the recess; and a gate electrode that is formed on the gate insulating film in the recess.

21 Claims, 3 Drawing Sheets

FIELD EFFECT TRANSISTOR

CROSS-REFERENCE TO RELATED APPLICATIONS

This application is based upon and claims the benefit of priority from the prior Japanese Patent Application No. 2010-083172, filed on Mar. 31, 2010 based upon Japanese Patent Application No. 2009-087361, filed on Mar. 31, 2009 and U.S. Provisional Patent Application No. 61/406,399, filed on Oct. 25, 2010; the entire contents of which are incorporated herein by reference.

BACKGROUND OF THE INVENTION

1. Field of the Disclosure

The invention relates to a field effect transistor made of a nitride compound semiconductor.

2. Description of the Related Art

Semiconductor devices, for example, GaN semiconductor devices using a group III-V nitride compound semiconductor represented by $Al_xIn_yGa_{1-x-y}As_uP_vN_{1-u-v}$ ($0 \leq x \leq 1$, $0 \leq y \leq 1$, $x+y \leq 1$, $0 \leq u \leq 1$, $0 \leq v \leq 1$, $u+v<1$) have a large bandgap energy and a good heat resistance and thus are excellent in high temperature operations compared to GaAs semiconductor devices. Especially, a field effect transistor (FET) using GaN/AlGaN semiconductors has been developed. In a horizontal device, a MOSFET (Metal-Oxide-Semiconductor Field Effect Transistor) structure is used to realize normally-off type operations. Because a field effect transistor having this structure is operable at a high current, its application to a power device is expected.

For example, International Patent Publication No. 2003/071607 discloses a normally-off field effect transistor having the structure called hybrid MOSHEMT (Metal-Oxide-Semiconductor High Electron Mobility Transistor). This field effect transistor has a HEMT structure in which a carrier traveling layer formed of an undoped GaN semiconductor and a carrier supplying layer formed of an AlGaN semiconductor are sequentially stacked on a p-type layer formed of a p-type GaN semiconductor. Two-dimensional electron as having a high mobility is used as carrier to realize a low on-resistance, in which the electron gas is generated near the heterojunction interface of the carrier traveling layer with the carrier supplying layer. The field effect transistor forms a recess by etching the carrier supplying layer and the carrier traveling layer only in the vicinity of a gate in order to realize normally-off type operations.

In the field effect transistor, because the p-type layer and the carrier traveling layer have a RESURF structure and thus relieve a local concentration of an electric field, a high withstand voltage can be achieved. The withstand voltage characteristics of the RESURF structure depends on a balance between the p-type carriers in the p-type layer and the two-dimensional electron gas carriers in the carrier traveling layer.

In order to realize a high withstand voltage, a technique is disclosed for providing a semiconductor layer formed of an AlGaN semiconductor in addition to the carrier supplying layer to form a double hetero structure (see "D. Visalli, et al., Solid State Device Meetings 2008-proceedings, No. G-1-2").

However, when a carrier concentration of the two-dimensional electron gas is enhanced to improve the on-characteristic in the normally-off field effect transistor having the hybrid MOSHEMT structure, it becomes difficult to keep a balance of the carriers in the RESURF structure and thus difficult to maintain the withstand voltage. Accordingly, it is difficult to keep low on-resistance characteristics and high withstand voltage characteristics in a well-balanced way.

BRIEF SUMMARY OF THE INVENTION

It is an object of the present invention to at least partially solve the problems in the conventional technology.

According to an aspect of the present invention, there is provided a field effect transistor made of a nitride compound semiconductor. The field effect transistor includes: a substrate; a buffer layer that is formed on the substrate; a high resistance layer or a foundation layer that is formed on the buffer layer; a carrier concentration controlling layer containing carbon that is formed on the high resistance layer or the foundation layer; a carrier traveling layer that is formed on the carrier concentration controlling layer; a carrier supplying layer that is formed on the carrier traveling layer; a recess that is formed from the carrier supplying layer up to a predetermined depth; a source electrode and a drain electrode that are formed on the carrier supplying layer with the recess intervening therebetween; a gate insulating film that is formed on the carrier supplying layer so as to cover the recess; and a gate electrode that is formed on the gate insulating film in the recess.

These and other objects, features, aspects, and advantages of the present disclosure will become apparent to those skilled in the art from the following detailed description, which, taken in conjunction with the annexed drawings, discloses preferred embodiments of the present disclosure.

DESCRIPTION OF THE PREFERRED EMBODIMENTS

Hereinafter, exemplary embodiments of a field effect transistor according to the present invention will be described in detail with reference to the attached drawings. The invention is not limited to these embodiments but various modifications are possible without departing from the spirit of the invention.

Figure 1:
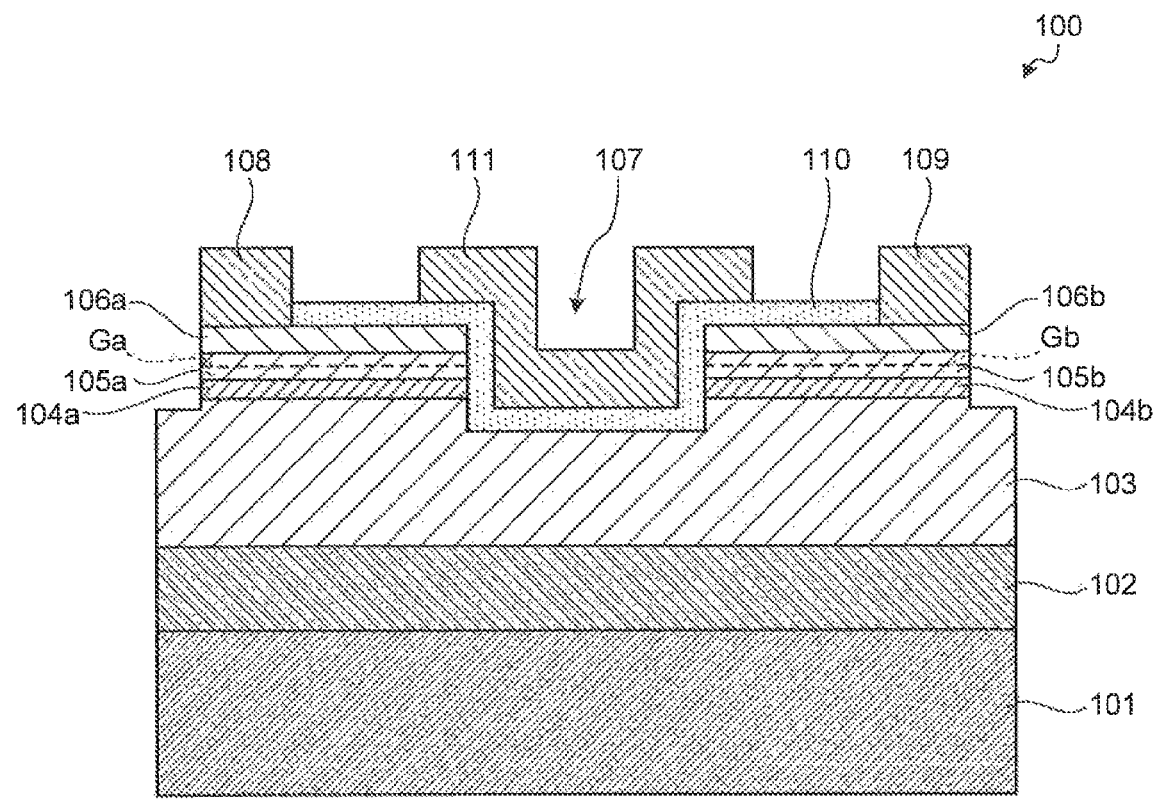
FIG. 1 is a schematic cross-sectional view of MOSFET according to a first embodiment of the present invention.

FIG. 1 is a schematic cross-sectional view of MOSFET 100 according to a first embodiment of the present invention. The MOSFET 100 includes a Si substrate 101 with the main surface (111), a buffer layer 102 that is formed on the substrate 101 and has a stacked structure of AlN/GaN, and a high resistance layer 103 that is formed of p-GaN containing Mg on the buffer layer 102.

The MOSFET 100 further includes carrier concentration controlling layers 104a and 104b that are formed on the high resistance layer 103. The carrier concentration controlling layers 104a and 104b contain carbon of about $5 \times 10^{17}$ cm$^{-3}$ to $5 \times 10^{19}$ cm$^{-3}$. The carrier concentration controlling layers 104a and 104b are isolated by a recess 107 that is formed deep into the high resistance layer 103. The width of the recess 107 is, for example, about 2 μm. The MOSFET 100 further includes carrier traveling layers 105a and 105b that are respectively formed on the carrier concentration controlling layers 104a and 104b. The carrier traveling layers 105a and 105b are formed of undoped u-GaN and have a thickness of, for example, 2 nm or more and 500 nm or less, preferably 5 nm or more and 80 nm or less. Furthermore, the MOSFET 100 includes carrier supplying layers 106a and 106b that are respectively formed on the carrier traveling layers 105a and 105b. The carrier supplying layers 106a and 106b are made of undoped AlGaN having a higher bandgap energy than that, of GaN forming the carrier traveling layers 105a and 105b and have a thickness of 1 nm to 50 nm, preferably 20 nm to 25 nm. The carrier supplying layers 106a and 106b have the Al composition ratio of 0.25. However, the Al composition ratio is not particularly limited to this but it may be for example, 0.01 to 0.99.

Due to a difference of the handgap energy between the carrier traveling layers 105a and 105b and the carrier supplying layers 106a and 106b in the MOSFET 100, the carrier traveling layers 105a and 105h respectively have areas Ga and Gb, in which two-dimensional electron gas with high mobility is generated, in heterojunction interfaces with the carrier supplying layers 106a and 106b. The carrier concentration of the two-dimensional electron gas areas Ga and Gb is preferably about $1\times10^{12}$ cm$^{-2}$ to $1\times10^{13}$ cm$^{-2}$.

The MOSFET 100 further includes a source electrode 108 and a drain electrode 109 that are respectively formed on the carrier supplying layer 106a and the carrier supplying layer 106b with the recess 107 intervening therebetween. The MOSFET 100 further includes a gate insulating film 110 and a gate electrode 111 to form the MOS structure. The gate insulating film 110 is formed of SiO or the like to cover the recess 107 on the carrier supplying layers 106a and 106b. The gate electrode 111 is formed on the gate insulating film 110 around the recess 107. The interval between the source electrode 108 and the drain electrode 109 is, for example, about 30 μm.

The MOSFET 100 operates as a normally-off device by the recess 107 that is formed from the carrier supplying layers 106a and 106b up to the inside of the high resistance layer 103. Because the two-dimensional electron gas in the areas Ga and Gb is used as carriers, an access resistance is decreased so as to achieve a low on-resistance and a high-speed operation.

The MOSFET 100 includes the high resistance layer 103 formed of p-GaN containing Mg between the buffer layer 102 and the carrier concentration controlling layers 104a and 104b in order to raise withstand voltage characteristics. In terms of controlling a threshold, it is preferable that the Mg concentration and carbon concentration in the high resistance layer 103 is $5\times10^{17}$ cm$^{-3}$ or more and that the thickness is 2 nm to 1000 nm.

The concentration of impurities such as carbon in the carrier traveling layers 105a and 105b is preferably $5\times10^{17}$ cm$^{-3}$ or less in order to keep the mobility high.

In the MOSFET 100, the carrier concentration controlling layers 104a and 104b can make it easy to control the carrier concentration of the two-dimensional electron gas areas Ga and Gb. As a result, a balance between the carrier concentration of the two-dimensional electron gas areas Ga and Gb and the p-type carrier in the high resistance layer 103 can be kept well and thus the withstand voltage can be maintained.

Figure 2:
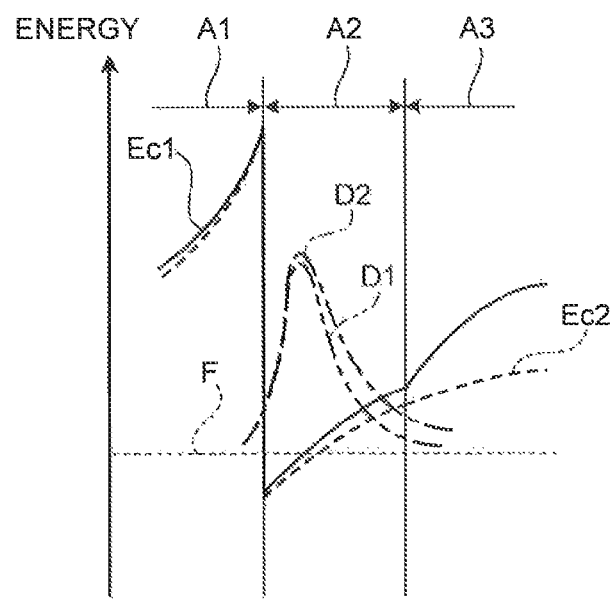
FIG. 2 is a graph illustrating a carrier concentration distribution of two-dimensional electron gas at energy levels and in a stacking direction of semiconductor layers.

It is supposed that the control principle of the carrier concentration of the two-dimensional electron gas areas Ga and Gb performed by the carrier concentration controlling layers 104a and 104b is as follows. FIG. 2 is a graph illustrating a carrier concentration distribution of two-dimensional electron gas at energy levels and in a stacking direction of the semiconductor layers. In FIG. 2, a reference symbol F indicates the Fermi level. A region A1 indicates an AlGaN layer corresponding to the carrier supplying layers 106a and 106b in the MOSFET 100 illustrated in FIG. 1. A region A2 indicates an undoped GaN layer corresponding to the carrier traveling layers 105a and 105b.

Assuming that a region A3 is a layer formed of undoped GaN, the level of a conduction band is as illustrated by a level Ec2 represented by a dotted line, and the carrier concentration distribution of the two-dimensional electron gas is as illustrated by a distribution D2. In this way, the distribution D2 has a shape that extends to the region A3.

Next, assuming that the region A3 is a layer formed of GaN containing carbon corresponding to the carrier concentration controlling layers 104a and 104b in the MOSFET 100 illustrated in FIG. 1, the level of the conduction band is as illustrated by a level Ec1 represented by a solid line, and the carrier concentration distribution of the two-dimensional electron gas is as illustrated by a distribution D1. In this case, because the carriers distributed in the region A3 of the two-dimensional electron gas are compensated by the carbon, the carrier concentration distribution is changed from the distribution D2 to the distribution D1 and the entire carrier concentration of the two-dimensional electron gas is decreased. According to this, the level Ec1 is raised up with respect to the Fermi level F in the region A3 and thus is raised also in the region A2.

However, because the state of the interface between the AlGaN layer and the GaN layer that are positioned at the boundary between the region A1 and the region A2 is not changed due to the existence of the GaN layer containing carbon, the carrier concentration near the interface is not almost changed. As a result, it is assumed that low on-resistance characteristics are maintained in spite of the decrease of the entire carrier concentration.

As mentioned above, because the sufficient generation of the two-dimensional electron gas and the maintenance of a carrier balance are realized at the same time in the MOSFET 100, the MOSFET can have a low on-resistance and a high withstand voltage.

In order to increase the two-dimensional electron gas and maintain a low on-resistance, it is only necessary that the thickness or the Al composition ratio of the carrier supplying layers 106a and 106b is increased. Furthermore, in order to decrease the entire carrier concentration of the two-dimensional electron gas, it is only necessary that the carbon concentration in the carrier concentration controlling layers 104a and 104b is increased or the thickness of the carrier traveling layers 105a and 105b is decreased to increase an overlap of the carrier concentration distribution of the two-dimensional electron gas and the carrier concentration controlling layers 104a and 104b.

Figure 3:
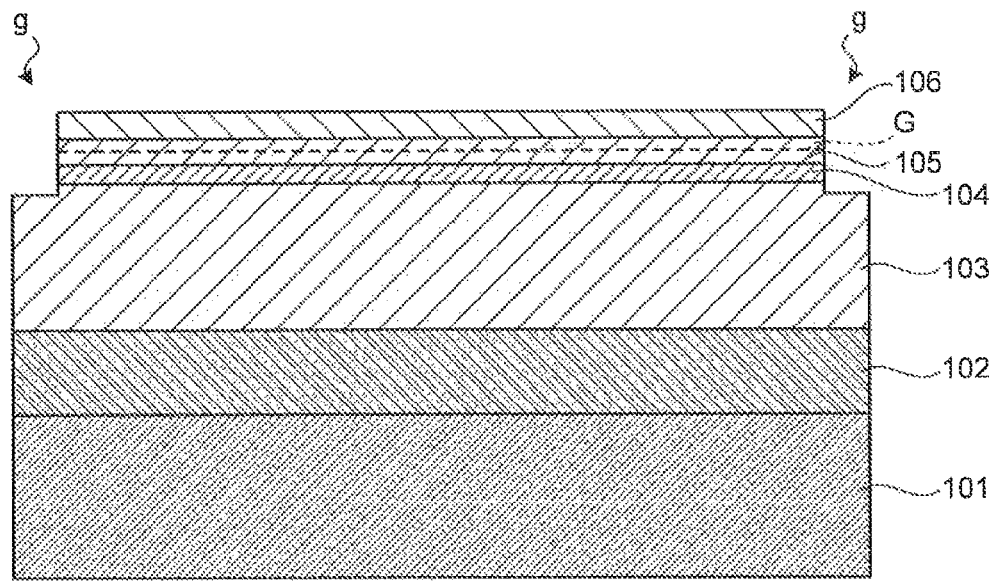
FIGS. 3 and 4 are process views explaining an example of a method of manufacturing the MOSFET illustrated in FIG.
Figure 4:
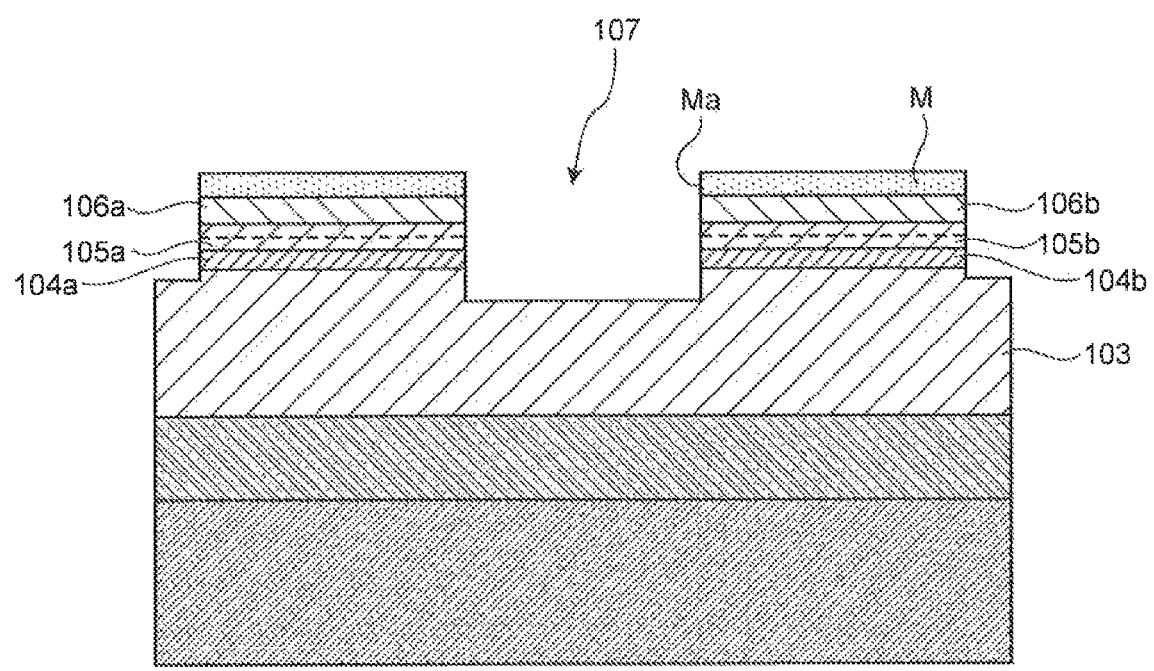

Next, it will be explained about a method of manufacturing the MOSFET 100. FIGS. 3 and 4 are process views explaining an example of a method of manufacturing the MOSFET 100 illustrated in FIG. 1. The following description will be made in the case of using the metal organic chemical vapor deposition (MOCVD) method, but a growth method is not particularly limited to this At first, as illustrated in FIG. 3, the Si substrate 101 with the main surface (111) is introduced into the MOCVD apparatus. After the MOCVD apparatus is evacuated up to the vacuum degree of $1\times10^{-6}$ hPa or less by using a turbo-pump, the substrate is heated to 1000° C. under the vacuum degree of 100 hPa. When the temperature gets stable, the substrate 101 is rotated at 900 rpm. Trimethyl aluminum (TMA) and ammonia that are raw materials are respectively introduced to the surface of the substrate 101 at the flow rate of 100 cm$^3$/mn and at the flow rate of 12 liters/min to grow an AlN layer. The growing time is 4 minutes and the thickness of the AlN layer is about 50 nm.

Similarly, the GaN layer with the thickness of 400 nm and the AlN layer with the thickness of 100 nm are alternately stacked and are grown for twelve cycles to form the buffer layer 102.

Next, the temperature is raised and maintained 1050° C. while flowing ammonia at the flow rate of 12 liters/min. After that, trimethyl gallium (TMG) and ammonia are introduced onto the buffer layer 102 respectively at the flow rates of 300 cm$^3$/min and 12 liters/min. As a result, the high resistance layer 103, a carbon containing GaN layer 104 that forms the carrier concentration controlling layers 104a and 104b, and a u-GaN layer 105 that forms the carrier traveling layers 105a and 105b are sequentially grown. The growing time is 2000 seconds in total and the thickness from the high resistance layer 103 to the u-GaN layer 105 is about 1000 nm in total. Two-dimensional electron gas G is generated in the u-GaN layer 105.

When forming the high resistance layer 103, bis-cyclopentadienyl magnesium (Cp2Mg) is used as a doping source of Mg, and the flow rate of Cp2Mg is adjusted according to a desired threshold voltage, for example, in such a manner that the Mg concentration may be about $1 \times 10^{17}$ cm$^{-3}$. When forming the carbon containing GaN layer 104, carbon can be added through auto doping of the carbon contained in an organo-metallic element that is a raw material while adjusting growing conditions such as the vacuum degree within the apparatus and the growing speed.

Next, TMA, TMG, and ammonia are introduced respectively at the flow rates of 50 cm$^3$/min, 100 cm$^3$/min, and 12 liters/min to grow an AlGaN layer 106 formed of $Al_{0.25}Ga_{0.75}N$ that forms the carrier supplying layers 106a and 106b. The growing time is 40 seconds and the thickness of the AlGaN layer 106 is 20 nm.

Next, photoresist is applied to the surface of the AlGaN layer 106, and a pattern for isolation is formed by using a photolithography process. Then, a groove g for isolation with the depth of about 200 nm is formed by using a dry etching method such as a reactive ion etching (PIE) method. Thereafter, the photoresist is removed.

As illustrated in FIG. 4, a mask layer M formed of amorphous silicon (a-Si) with the thickness of 500 nm is formed on the AlGaN layer 106, for example, by using a plasma CVD (PCVD) method, and patterning is performed thereon by using the photolithography process, and an opening Ma is formed in a region in which the recess 107 is formed. A region of the AlGaN layer 106 corresponding to the opening Ma of the mask layer is removed up to the inside of the high resistance layer 103 by performing the dry etching by using the mask layer M as a mask to form the recess 107. According to this, the carrier concentration controlling layers 104a and 104b, the carrier traveling layers 105a and 105b, and the carrier supplying layers 106a and 106b are formed. The depth of the recess 107 from the surface of the carrier supplying layers 106a and 106b is, for example, 200 nm.

Next, $SiH_4$ gas and $N_2O$ gas are used to form the gate insulating film 110, for example, with the thickness of 60 nm by using the PCVD method. The gate insulating film 110 may be formed by using a plasma enhanced CVD (PECVD) method or an atmospheric pressure CVD (APCVD) method. Then, resist is applied to the gate insulating film 110, openings are formed on portions of the gate insulating film 110 corresponding to the source electrode 108 and the drain electrode 109, and the surfaces of the carrier supplying layers 106a and 106b are exposed, by using the photolithography and the etching. For example, Ti, an alloy film of Al and Si, and W are sequentially deposited on the exposed surfaces to form the source electrode 108 and the drain electrode 109 by using the lift-off method.

Next, resist is applied to the gate insulating film 110, patterning is performed on the resist to form an opening on a portion on which the gate electrode 111 should be formed by using the photolithography and the etching, and Ti, Au or W is deposited on the portion to form the gate electrode 111 by using the lift-off method. The gate electrode 111 may be formed of a material such as polysilicon. According to this, the MOSFET 100 illustrated in FIG. 1 is completed.

As an example of the present invention, the MOSFET formed as illustrated in FIG. 1 is manufactured and its on-resistance and breakdown voltage are measured. In the MOSFET according to this example, the thickness of the carrier concentration controlling layer is set to 20 nm and the carbon concentration thereof is stepwise decreased from $5 \times 10^{19}$ cm$^{-3}$ to $5 \times 10^{17}$ cm$^{-3}$ from the substrate side toward the surface side. The thickness of the carrier traveling layer is set to 80 nm. The carrier supplying layer is formed of $Al_{0.25}Ga_{0.75}N$ with the thickness of 20 nm.

On the other hand, as a comparison example of the MOSFET according to the above example, the carrier concentration controlling layer is replaced with the u-GaN layer with the same thickness and its on-resistance and breakdown voltage are measured.

As a result, the MOSFET according to the comparison example has the low on-resistance of about 5 mΩcm$^2$ and the breakdown voltage of about 500V. On the other hand, the MOSFET according to the example has the low on-resistance of about 5 mΩcm$^2$ similar to that of the comparison example and the breakdown voltage of about 1200V extremely higher than that of the comparison example.

Figure 5:
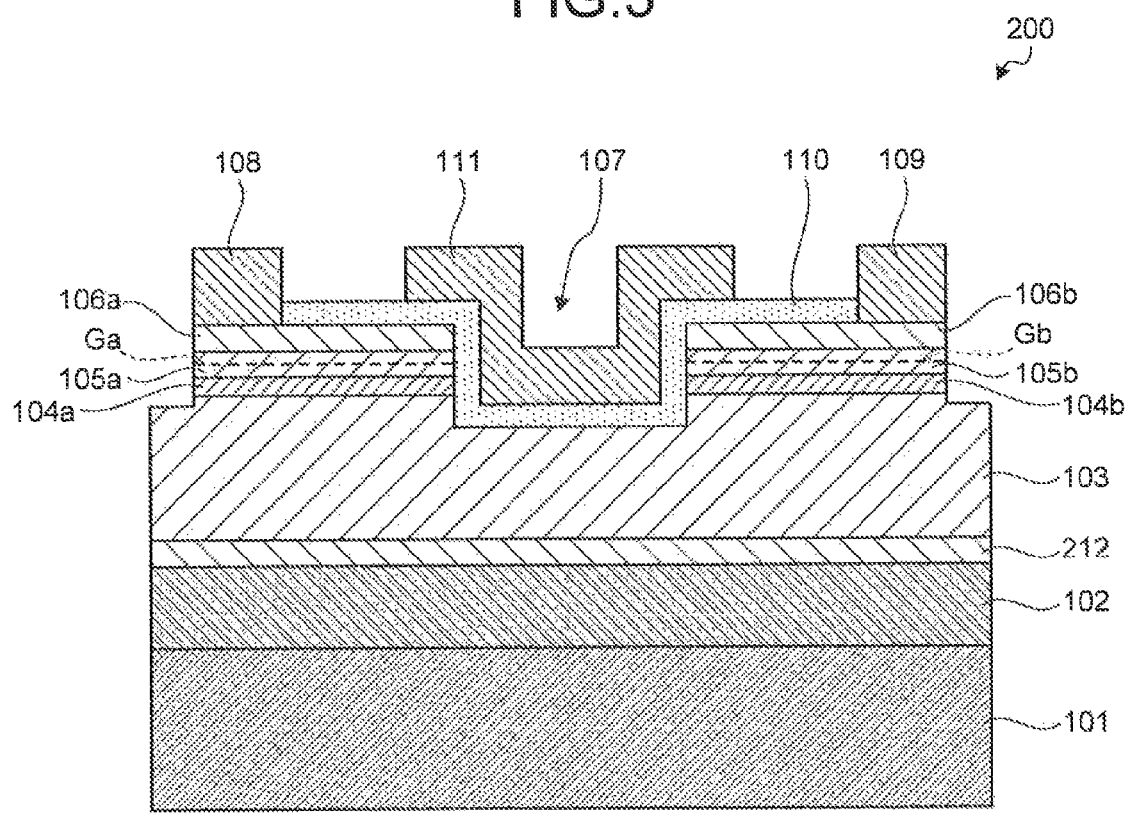
FIG. 5 is a schematic cross-sectional view of MOSFET according to a second embodiment of the present invention.

Now, it will be explained about a second embodiment of the present invention. FIG. 5 is a schematic cross-sectional view of MOSFET 200 according to the second embodiment. The MOSFET 200 further includes a heterojunction forming layer 212 between the buffer layer 102 and the nigh resistance layer 103, in addition to the structure of the MOSFET 100 according to the first embodiment illustrated in FIG. 1.

The heterojunction forming layer 212 is made of AlGaN that has a higher bandgap energy than that of GaN forming the high layer 103. The thickness of the heterojunction forming layer 212 is, for example, 5 nm to 40 nm and the Al composition ratio is, for example, 0.01 to 0.5.

Similarly to the MOST 100, the MOSFET 200 achieves a low on-resistance and a high withstand voltage due to the carrier concentration controlling layers 104a and 104b. The MOSFET 200 achieves a further high withstand voltage due to the same operation as that described in "D. Visalli, et al., Solid State Device Meetings 2008-proceedings, No. G-1-2" because the carrier supplying layers 106a and 106b and the hetero function forming layer 212 form a double hetero structure of AlGaN/GaN.

In the embodiment, the high resistance layer is formed of p-GaN containing Mg. However, the high resistance layer may be formed of GaN containing carbon because withstand voltage characteristics can be improved due to high insulation properties. In this case, the carbon concentration in the high resistance layer is, for example, $1 \times 10^{19}$ cm$^{-3}$ in accordance with a desired threshold voltage.

Although the carrier traveling layer is undoped, the impurity concentration such as carbon is preferably $5 \times 10^{17}$ cm$^{-3}$ or less in order to keep the mobility high.

The materials of the high resistance layer, the carrier concentration controlling layer, the carrier traveling layer, the carrier supplying layer, and the heterojunction forming layer according to the first and second embodiments are not limited to GaN and AlGaN. A nitride compound semiconductor having a desired dopant and bandgap energy may be properly used as the materials.

Figure 6:
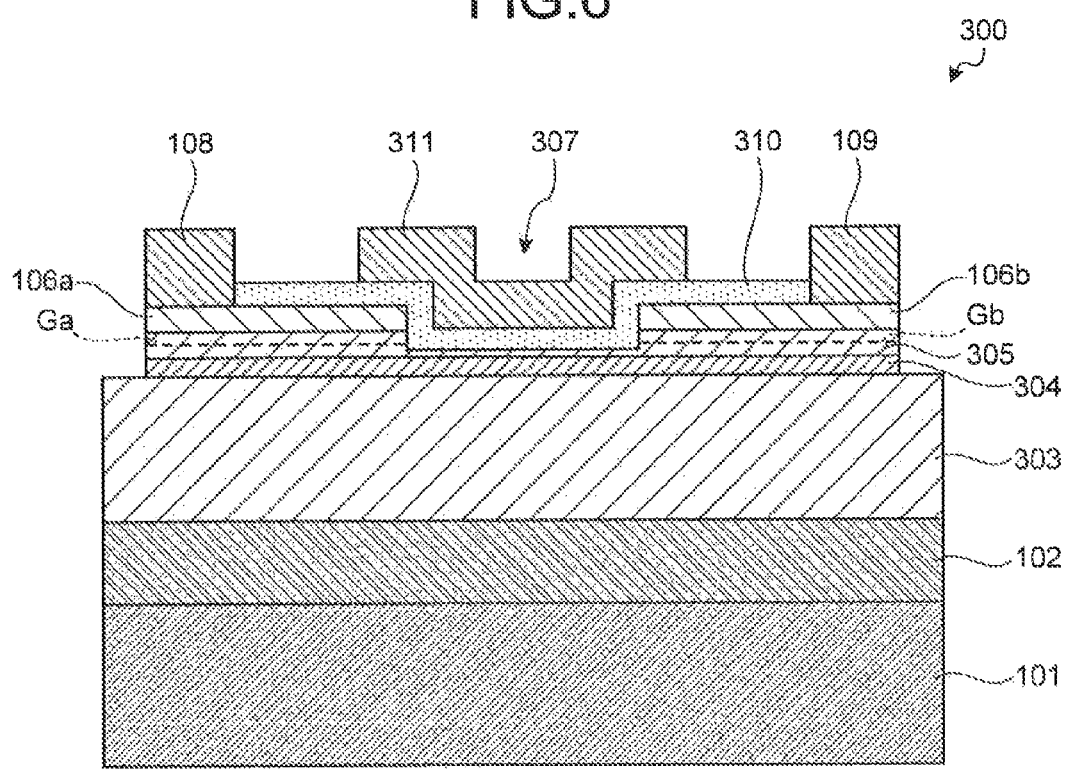
FIG. 6 is a schematic cross-sectional view of MOSFET according to a third embodiment of the present invention

Next, it will be explained about a third embodiment of the present invention. FIG. 6 is a schematic cross-sectional view of MOSFET 300 according to the third embodiment. The MOSFET 300 has a structure different from that of the MOSFET 100 according to the first embodiment illustrated in FIG. 1 in that the bottom surface of the recess is formed within the carrier traveling layer.

In other words, the MOSFET 300 has a structure that includes a foundation layer 303 formed of p-GaN containing Mg instead of the high resistance layer 103 in the MOSFET 100, a carrier concentration controlling layer 304 instead of the carrier concentration controlling layers 104a and 104b, a carrier traveling layer 305 instead of the carrier traveling layers 105a and 105b, and a gate insulating film 310 and a gate electrode 311 instead of the gate insulating film 110 and the gate electrode 111. The replaced components have the same thicknesses and are made of the same materials as those of the original components. The recess 307 is formed from the carrier supplying layers 106a and 106b up to the inside of the carrier traveling layer 305.

Similarly to the MOSFET 100, the MOSFET 300 achieves a low on-resistance and a high withstand voltage due to the carrier concentration controlling layer 304. The MOSFET 300 achieves a further lower on-resistance while keeping the withstand voltage because a channel is formed in the carrier traveling layer 305.

Because the foundation layer made of GaN containing carbon is near the carrier traveling layer in the third embodiment, the MOSFET has high insulation properties and thus withstand voltage characteristics can be improved. In this case, the carbon concentration in the foundation layer is, for example, $1 \times 10^{19}$ cm$^{-3}$ in accordance with a desired threshold voltage.

The materials of the foundation layer, the carrier concentration controlling layer, the carrier traveling layer, and the carrier supplying layer according to the third embodiment are not limited to GaN and AlGaN. A nitride compound semiconductor having a desired dopant and bandgap energy may be properly used as the materials. When the structure of the third embodiment includes the hetero unction forming layer similar to that of the second embodiment, the same effect can be also achieved.

The substrates of the embodiments are not limited to a Si substrate. A substrate capable of growing a nitride compound semiconductor may be used, such as SiC substrate, sapphire substrate, GaN substrate, MgO substrate, and ZnO substrate.

As described above, the present invention is preferably applied to a field effect transistor for use in a high temperature, high power, or high frequency environment.

Additional advantages and modifications will readily occur to those skilled in the art. Therefore, the disclosure in its broader aspects is not limited to the specific details, representative embodiments and alternate examples shown and described herein. Accordingly, various modifications may be made without departing from the spirit or scope of the general inventive concept as defined by the appended claims and their equivalents. Furthermore, the above-mentioned embodiments and the alternate examples can be arbitrarily combined with one another.

What is claimed is:

1. A field effect transistor made of a nitride compound semiconductor, the field effect transistor comprising:
   a substrate;
   a buffer layer that is formed on the substrate;
   a high resistance layer or a foundation layer that is formed on the buffer layer;
   a carrier concentration controlling layer containing carbon that is formed on the high resistance layer or the foundation layer;
   a carrier traveling layer that is formed on the carrier concentration controlling layer;
   a carrier supplying layer that is formed on the carrier traveling layer;
   a recess that extends from the carrier supplying layer into the high resistance layer or the foundation layer;
   a source electrode and a drain electrode that are formed on the carrier supplying layer with the recess intervening therebetween;
   a gate insulating film that is formed on the carrier supplying layer so as to cover the recess; and
   a gate electrode that is formed on the gate insulating film in the recess, wherein
   the carrier traveling layer includes a two-dimensional electron gas generated therein due to a difference of bandgap energy between the carrier traveling layer and the carrier supplying layer.

2. The field effect transistor according to claim 1, wherein a carbon concentration of the carrier concentration controlling layer is from $5 \times 10^{17}$ cm$^{-3}$ to $5 \times 10^{19}$ cm$^{-3}$.

3. The field effect transistor according to claim 1, wherein a carrier concentration of the two-dimensional electron gas generated in the carrier traveling layer is $1 \times 10^{12}$ cm$^{-2}$ to $1 \times 10^{13}$ cm$^{-2}$.

4. The field effect transistor according to claim 1, wherein the high resistance layer or the foundation layer is made of GaN containing Mg or carbon.

5. The field effect transistor according to claim 1, wherein the carrier traveling layer is made of undoped GaN and has a thickness of 2 nm or more and 500 nm or less.

6. The field effect transistor according to claim 1, wherein the carrier supplying layer is made of AlGaN having an Al composition ratio of 0.01 to 0.99 and a thickness of 1 nm or more and 50 nm or less.

7. The field effect transistor according to claim 1, further comprising a heterojunction forming layer that is formed between (i) the buffer layer and (ii) the high resistance layer or the foundation layer and that has a bandgap energy different from that of the high resistance layer or the foundation layer.

8. The field effect transistor according to claim 7, wherein the heterojunction forming layer is made of AlGaN having an Al composition ratio of 0.01 to 0.5.

9. The field effect transistor according to claim 1, wherein a carbon concentration of the carrier concentration controlling layer is decreased in a monotonous manner from the high resistance layer or the foundation layer side toward the carrier traveling layer side.

10. The field effect transistor according to claim 1, wherein the carrier traveling layer is made of GaN containing carbon with a concentration of the carbon lower than $5 \times 10^{17}$ cm$^{-3}$.

11. A field effect transistor made of a nitride compound semiconductor, the field effect transistor comprising:
   a substrate;
   a buffer layer that is formed on the substrate;
   a high resistance layer or a foundation layer that is formed on the buffer layer;

a carrier concentration controlling layer containing carbon that is formed on the high resistance layer or the foundation layer;

a carrier traveling layer that is formed on the carrier concentration controlling layer;

a carrier supplying layer that is formed on the carrier traveling layer;

a recess formed at least in the carrier supplying layer and the carrier traveling layer;

a source electrode and a drain electrode that are formed on the carrier supplying layer with the recess intervening therebetween;

a gate insulating film that is formed on the carrier supplying layer so as to cover the recess; and a gate electrode that is formed on the gate insulating film in the recess, wherein the carrier traveling layer includes a two-dimensional electron gas generated therein due to a difference of bandgap energy between the carrier traveling layer and the carrier supplying layer, and a carbon concentration of the carrier concentration controlling layer is from $5 \times 10^{17}$ cm$^{-3}$ to $5 \times 10^{19}$ cm$^{-3}$.

12. The field effect transistor according to claim 11, wherein a carrier concentration of the two-dimensional electron gas generated in the carrier traveling layer is $1 \times 10^{12}$ cm$^{-2}$ to $1 \times 10^{13}$ cm$^{-2}$.

13. The field effect transistor according to claim 11, wherein the high resistance layer or the foundation layer is made of GaN containing Mg or carbon.

14. The field effect transistor according to claim 11, wherein the carrier traveling layer is made of undoped GaN and has a thickness of 2 nm or more and 500 nm or less.

15. The field effect transistor according to claim 11, wherein the carrier supplying layer is made of AlGaN having an Al composition ratio of 0.01 to 0.99 and a thickness of 1 nm or more and 50 nm or less.

16. The field effect transistor according to claim 11, further comprising a heterojunction forming layer that is formed between (i) the buffer layer and (ii) the high resistance layer or the foundation layer and that has a bandgap energy different from that of the high resistance layer or the foundation layer.

17. The field effect transistor according to claim 16, wherein the heterojunction forming layer is made of AlGaN having an Al composition ratio of 0.01 to 0.5.

18. The field effect transistor according to claim 11, wherein a carbon concentration of the carrier concentration controlling layer is decreased in a monotonous manner from the high resistance layer or the foundation layer side toward the carrier traveling layer side.

19. The field effect transistor according to claim 11, wherein the recess extends downward from the carrier supplying layer into the high resistance layer or the foundation layer.

20. The field effect transistor according to claim 11, wherein the carrier traveling layer is made of GaN containing carbon with a concentration of the carbon lower than $5 \times 10^{17}$ cm$^{-3}$.

21. The field effect transistor according to claim 1, wherein the two-dimensional electron gas is generated in the carrier traveling layer near an interface between the carrier traveling layer and the carrier supplying layer.

* * * * *